United States Patent
Fleege et al.

(10) Patent No.: US 6,591,482 B1
(45) Date of Patent: Jul. 15, 2003

(54) ASSEMBLY METHODS FOR MINIATURE CIRCUIT BREAKERS WITH ELECTRONICS

(75) Inventors: Dennis William Fleege, Cedar Rapids, IA (US); Brett Eugene Larson, Cedar Rapids, IA (US); James Virgal Fixemer, Denton, NE (US)

(73) Assignee: Square D Company, Palatine, IL (US)

( * ) Notice: Subject to any disclaimer, the term of this patent is extended or adjusted under 35 U.S.C. 154(b) by 99 days.

(21) Appl. No.: 09/715,609

(22) Filed: Nov. 17, 2000

Related U.S. Application Data

(60) Division of application No. 08/796,745, filed on Feb. 6, 1997, now Pat. No. 6,242,993, which is a continuation-in-part of application No. 08/600,512, filed on Feb. 13, 1996, now Pat. No. 5,682,101, which is a continuation-in-part of application No. 08/402,678, filed on Mar. 13, 1995, now abandoned, and a continuation-in-part of application No. 08/402,600, filed on Mar. 13, 1995, now abandoned, and a continuation-in-part of application No. 08/402,575, filed on Mar. 13, 1995, now abandoned, and a continuation-in-part of application No. 08/403,084, filed on Mar. 13, 1995, now abandoned, and a continuation-in-part of application No. 08/403,033, filed on Mar. 13, 1995, now abandoned.

(51) Int. Cl.$^7$ .................................................. H01F 7/06
(52) U.S. Cl. ........................ 29/605; 29/602.1; 29/606; 336/175; 336/221
(58) Field of Search ................................ 29/602.1, 605, 29/606; 361/93.6, 115; 335/18, 132, 202; 336/176, 175, 221, 84 R; 242/434.7

(56) References Cited

U.S. PATENT DOCUMENTS

| | | | |
|---|---|---|---|
| 2,808,566 A | 10/1957 | Douma | 324/127 |
| 2,832,642 A | 4/1958 | Lennox | 299/132 |
| 2,898,420 A | 8/1959 | Kuze | 200/87 |
| 3,471,784 A | 10/1969 | Arndt et al. | 324/126 |
| 3,538,241 A | 11/1970 | Rein | 174/143 |
| 3,588,611 A | 6/1971 | Lambden et al. | 317/31 |
| 3,600,502 A | 8/1971 | Wagenaar et al. | 174/143 |
| 3,622,872 A | 11/1971 | Boaz et al. | 324/52 |
| 3,660,721 A | 5/1972 | Baird | 361/55 |
| 3,684,955 A | 8/1972 | Adams | 324/72 |

(List continued on next page.)

FOREIGN PATENT DOCUMENTS

| | | |
|---|---|---|
| EP | 0 094 871 A1 | 5/1983 |
| EP | 0 615 327 | 9/1994 |
| EP | 0 649 207 A1 | 4/1995 |
| EP | 0 748 021 A1 | 12/1996 |
| EP | 0 762 591 A2 | 3/1997 |

(List continued on next page.)

OTHER PUBLICATIONS

Antonio N. Paolantonio, P.E., Directional Couplers, R.F. Design, Sep./Oct., 1979, pp. 40–49.

Alejandro Duenas, J., Directional Coupler Design Graphs For Parallel Coupled Lines and Interdigitated3 dB Couplers, RF Design, Feb., 1986, pp. 62–64.

(List continued on next page.)

Primary Examiner—Peter Vo
Assistant Examiner—Minh Trinh
(74) Attorney, Agent, or Firm—Kareem M. Irfan; Larry I. Golden

(57) ABSTRACT

The present invention provides an apparatus for use in arcing fault detection systems within circuit breakers and which is adapted for automated production by top-down assembly. In one embodiment, the apparatus includes a circuit board and a two-piece sensing coil within a two piece housing with its center oriented horizontally relative to the circuit board. In other embodiments the sensing coil is one-piece and is either preassembled with a sensing bus and oriented horizontally or oriented vertically relative to the circuit board. The invention also includes several methods for making electrical connections to the circuit breakers.

2 Claims, 8 Drawing Sheets

U.S. PATENT DOCUMENTS

| | | | |
|---|---|---|---|
| 3,716,757 A | 2/1973 | Rodriguez | 317/40 |
| 3,746,930 A | 7/1973 | Van Best et al. | 317/31 |
| 3,775,675 A | 11/1973 | Freeze et al. | 324/51 |
| 3,812,337 A | 5/1974 | Crosley | 235/153 AC |
| 3,858,130 A | 12/1974 | Misencik | 335/18 |
| 3,869,665 A | 3/1975 | Kenmochi et al. | 324/72 |
| 3,878,460 A | 4/1975 | Nimmersjo | 324/52 |
| 3,911,323 A | 10/1975 | Wilson et al. | 317/18 |
| 3,914,667 A | 10/1975 | Waldron | 317/36 |
| 3,932,790 A | 1/1976 | Muchnick | 317/18 D |
| 3,939,410 A | 2/1976 | Bitsch et al. | 324/72 |
| 4,052,751 A | 10/1977 | Shepard | 361/50 |
| 4,074,193 A | 2/1978 | Kohler | 324/126 |
| 4,081,852 A | 3/1978 | Coley et al. | 361/45 |
| 4,087,744 A | 5/1978 | Olsen | 324/51 |
| 4,156,846 A | 5/1979 | Harrold et al. | 324/158 |
| 4,166,260 A | 8/1979 | Gillette | 335/20 |
| 4,169,260 A | 9/1979 | Bayer | 340/562 |
| 4,214,210 A | 7/1980 | O'Shea | 455/282 |
| 4,233,640 A | 11/1980 | Klein et al. | 361/44 |
| 4,245,187 A | 1/1981 | Wagner et al. | 324/74 |
| 4,251,846 A | 2/1981 | Pearson et al. | 361/30 |
| 4,264,856 A | 4/1981 | Frierdich et al. | 322/25 |
| RE30,678 E | 7/1981 | Van Zeeland et al. | 361/44 |
| 4,316,187 A | 2/1982 | Spencer | 340/664 |
| 4,344,100 A | 8/1982 | Davidson et al. | 361/45 |
| 4,354,154 A | 10/1982 | Schiemann | 324/126 |
| 4,356,443 A | 10/1982 | Emery | 324/51 |
| 4,378,525 A | 3/1983 | Burdick | 324/127 |
| 4,387,336 A | 6/1983 | Joy et al. | 324/51 |
| 4,459,576 A | 7/1984 | Fox et al. | 336/84 |
| 4,466,071 A | 8/1984 | Russell, Jr. | 364/492 |
| 4,477,855 A | 10/1984 | Nakayama et al. | 361/54 |
| 4,507,709 A * | 3/1985 | Morris et al. | 361/400 |
| 4,587,588 A | 5/1986 | Goldstein | 361/54 |
| 4,616,200 A | 10/1986 | Fixemer et al. | 335/35 |
| 4,639,817 A | 1/1987 | Cooper et al. | 361/62 |
| 4,642,733 A | 2/1987 | Schacht | |
| 4,644,439 A | 2/1987 | Taarning | 361/87 |
| 4,652,867 A | 3/1987 | Masot | 340/638 |
| 4,658,322 A | 4/1987 | Rivera | 361/37 |
| 4,697,218 A | 9/1987 | Nicolas | 633/882 |
| 4,702,002 A * | 10/1987 | Morris et al. | 29/837 |
| 4,707,759 A | 11/1987 | Bodkin | 831/642 |
| 4,771,355 A | 9/1988 | Emery et al. | 361/33 |
| H536 H | 10/1988 | Strickland et al. | 324/456 |
| 4,775,917 A * | 10/1988 | Eichhorn et al. | 361/388 |
| H538 H | 11/1988 | Betzold | 89/134 |
| 4,810,954 A | 3/1989 | Fam | 324/142 |
| 4,816,958 A | 3/1989 | Belbel et al. | 361/93 |
| 4,833,564 A | 5/1989 | Pardue et al. | 361/93 |
| 4,835,648 A | 5/1989 | Yamauchi | 361/14 |
| 4,839,600 A | 6/1989 | Kuurstra | 324/127 |
| 4,845,580 A | 7/1989 | Kitchens | 361/91 |
| 4,847,719 A | 7/1989 | Cook et al. | 361/13 |
| 4,853,818 A | 8/1989 | Emery et al. | 361/33 |
| 4,858,054 A | 8/1989 | Franklin | 361/57 |
| 4,866,560 A | 9/1989 | Allina | 361/104 |
| 4,882,682 A | 11/1989 | Takasuka et al. | 364/507 |
| 4,893,102 A | 1/1990 | Bauer | 335/132 |
| 4,901,183 A | 2/1990 | Lee | 361/56 |
| 4,922,368 A | 5/1990 | Johns | 361/62 |
| 4,931,894 A | 6/1990 | Legatti | 361/45 |
| 4,939,495 A | 7/1990 | Peterson et al. | 337/79 |
| 4,949,214 A | 8/1990 | Spencer | 361/95 |
| 4,969,063 A | 11/1990 | Scott et al. | 361/93 |
| 5,010,438 A | 4/1991 | Brady | 361/56 |
| 5,047,724 A | 9/1991 | Boksiner et al. | 324/520 |
| 5,051,731 A | 9/1991 | Guim et al. | 340/638 |
| 5,121,282 A | 6/1992 | White | 361/42 |
| 5,166,861 A | 11/1992 | Krom | 361/379 |
| 5,168,261 A | 12/1992 | Weeks | |
| 5,179,491 A | 1/1993 | Runyan | 361/45 |
| 5,185,684 A | 2/1993 | Beihoff et al. | 361/45 |
| 5,185,685 A | 2/1993 | Tennies et al. | 361/45 |
| 5,185,686 A | 2/1993 | Hansen et al. | 361/45 |
| 5,185,687 A | 2/1993 | Beihoff et al. | 361/45 |
| 5,206,596 A | 4/1993 | Beihoff et al. | 324/536 |
| 5,208,542 A | 5/1993 | Tennies et al. | 324/544 |
| 5,223,795 A | 6/1993 | Blades | 324/536 |
| 5,224,006 A | 6/1993 | MacKenzie et al. | 361/45 |
| 5,257,157 A | 10/1993 | Epstein | 361/111 |
| 5,280,404 A | 1/1994 | Ragsdale | 361/113 |
| 5,286,933 A | 2/1994 | Pham | |
| 5,307,230 A | 4/1994 | MacKenzie | 361/96 |
| 5,334,939 A | 8/1994 | Yarbrough | |
| 5,353,014 A | 10/1994 | Carroll et al. | 340/638 |
| 5,359,293 A | 10/1994 | Boksiner et al. | 324/544 |
| 5,363,269 A | 11/1994 | McDonald | |
| 5,373,241 A | 12/1994 | Ham, Jr. et al. | 324/520 |
| 5,383,084 A | 1/1995 | Gershen et al. | 361/113 |
| 5,388,021 A | 2/1995 | Stahl | 361/56 |
| 5,396,179 A | 3/1995 | Domenichini et al. | 324/546 |
| 5,412,526 A | 5/1995 | Kapp et al. | 361/56 |
| 5,414,395 A * | 5/1995 | Garnto et al. | 335/18 |
| 5,414,590 A | 5/1995 | Tajali | 361/669 |
| 5,420,740 A | 5/1995 | MacKenzie et al. | 361/45 |
| 5,424,894 A | 6/1995 | Briscall et al. | 361/45 |
| 5,434,509 A | 7/1995 | Blades | 324/536 |
| 5,444,424 A | 8/1995 | Wong et al. | 335/172 |
| 5,446,431 A | 8/1995 | Leach et al. | 335/18 |
| 5,448,443 A | 9/1995 | Muelleman | 361/111 |
| 5,452,223 A | 9/1995 | Zuercher et al. | 364/483 |
| 5,459,630 A | 10/1995 | MacKenzie et al. | 361/45 |
| 5,473,494 A | 12/1995 | Kurosawa et al. | 361/3 |
| 5,477,150 A | 12/1995 | Ham, Jr. et al. | 324/536 |
| 5,481,235 A | 1/1996 | Heise et al. | 335/18 |
| 5,483,211 A | 1/1996 | Carrodus et al. | 335/18 |
| 5,485,093 A | 1/1996 | Russell et al. | 324/522 |
| 5,493,278 A | 2/1996 | MacKenzie et al. | 340/638 |
| 5,499,189 A | 3/1996 | Seitz | 324/536 |
| 5,506,789 A | 4/1996 | Russell et al. | 364/492 |
| 5,510,946 A | 4/1996 | Franklin | |
| 5,512,832 A | 4/1996 | Russell et al. | 324/522 |
| 5,519,561 A | 5/1996 | Mrenna et al. | 361/105 |
| 5,531,617 A | 7/1996 | Marks | 439/723 |
| 5,546,266 A | 8/1996 | Mackenzie et al. | 361/93 |
| 5,561,605 A | 10/1996 | Zuercher et al. | 364/483 |
| 5,568,371 A | 10/1996 | Pitel et al. | 363/39 |
| 5,578,931 A | 11/1996 | Russell et al. | 324/536 |
| 5,590,010 A | 12/1996 | Ceola et al. | 361/93 |
| 5,590,012 A | 12/1996 | Dollar | 361/113 |
| 5,602,709 A | 2/1997 | Al-Dabbagh | 361/85 |
| 5,608,328 A | 3/1997 | Sanderson | 324/529 |
| 5,617,019 A | 4/1997 | Etter | 324/117 |
| 5,638,244 A | 6/1997 | Mekanik et al. | 361/62 |
| 5,657,244 A | 8/1997 | Seitz | 364/492 |
| 5,659,453 A | 8/1997 | Russell et al. | |
| 5,661,645 A | 8/1997 | Hochstein | 363/89 |
| 5,682,101 A | 10/1997 | Brooks et al. | 324/536 |
| 5,691,869 A | 11/1997 | Engel et al. | |
| 5,701,110 A | 12/1997 | Scheel et al. | 335/132 |
| 5,706,154 A | 1/1998 | Seymour | 361/42 |
| 5,729,145 A | 3/1998 | Blades | 324/536 |
| 5,805,397 A | 9/1998 | MacKenzie | 361/42 |
| 5,805,398 A | 9/1998 | Rae | 361/42 |
| 5,815,352 A | 9/1998 | Mackenzie | 361/42 |
| 5,818,237 A | 10/1998 | Zuercher et al. | 324/536 |
| 5,818,671 A | 10/1998 | Seymour et al. | 361/42 |
| 5,825,598 A | 10/1998 | Dickens et al. | 361/42 |
| 5,834,940 A | 11/1998 | Brooks et al. | 324/424 |

| | | | |
|---|---|---|---|
| 5,835,319 A | 11/1998 | Welles, II et al. | 361/5 |
| 5,835,321 A | 11/1998 | Elms et al. | 361/45 |
| 5,839,092 A | 11/1998 | Erger et al. | 702/58 |
| 5,847,913 A | 12/1998 | Turner et al. | 361/93 |
| 5,860,207 A * | 1/1999 | Knight et al. | 29/605 |
| 5,886,861 A | 3/1999 | Parry | 361/42 |
| 5,889,643 A | 3/1999 | Elms | 361/42 |
| 5,896,262 A | 4/1999 | Rae et al. | 361/94 |
| 5,905,619 A | 5/1999 | Jha | 361/93 |
| 5,933,308 A | 8/1999 | Garzon | 361/62 |
| 5,946,179 A * | 8/1999 | Fleege et al. | 361/93 |
| 6,178,617 B1 * | 1/2001 | Larranaga et al. | 29/602.1 |
| 6,242,993 B1 * | 6/2001 | Fleege et al. | 335/18 |
| 6,249,204 B1 * | 6/2001 | Larranaga et al. | 336/198 |

FOREIGN PATENT DOCUMENTS

| | | |
|---|---|---|
| EP | 0 802 602 A2 | 10/1997 |
| GB | 2 177 561 A | 6/1985 |
| GB | 2285886 A | 7/1995 |
| WO | WO 97/30501 | 8/1997 |

OTHER PUBLICATIONS

RV4145 Low Power Ground Fault Interrupter, Preliminary Product Specifications of Integrated Circuits, Raytheon Company Semiconductor Division, 350 Ellis Street, Mountain View CA 94309–7016, pp. 1–8.

Jean–FrancoisJoubert, Feasibility of Main Service Ground–Fault Protection On The Electrical Service To Dwelling Units, Consultants Electro–ProtectionIns., 1980, Michelin St., Laval, Quebec H7L 9Z7. Oct. 26, 1990, pp. 1–77.

R.D. Russell, Detection Of Arcing Faults On Distribution Feeders, Texas A & M Research Foundation, Box H. College Station, Texas 77843, Final Report Dec., 1982, pp. 1–B18.

* cited by examiner

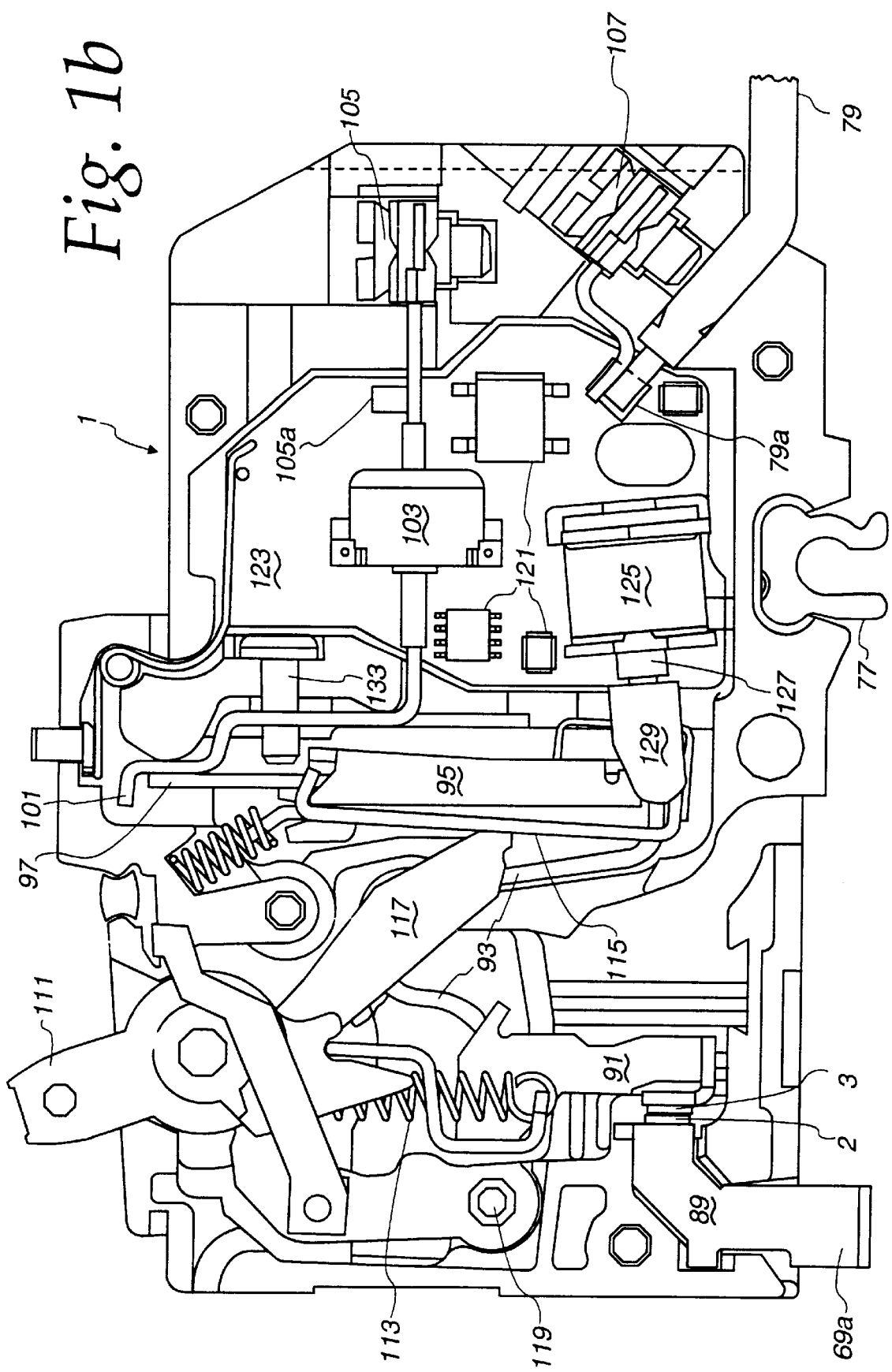

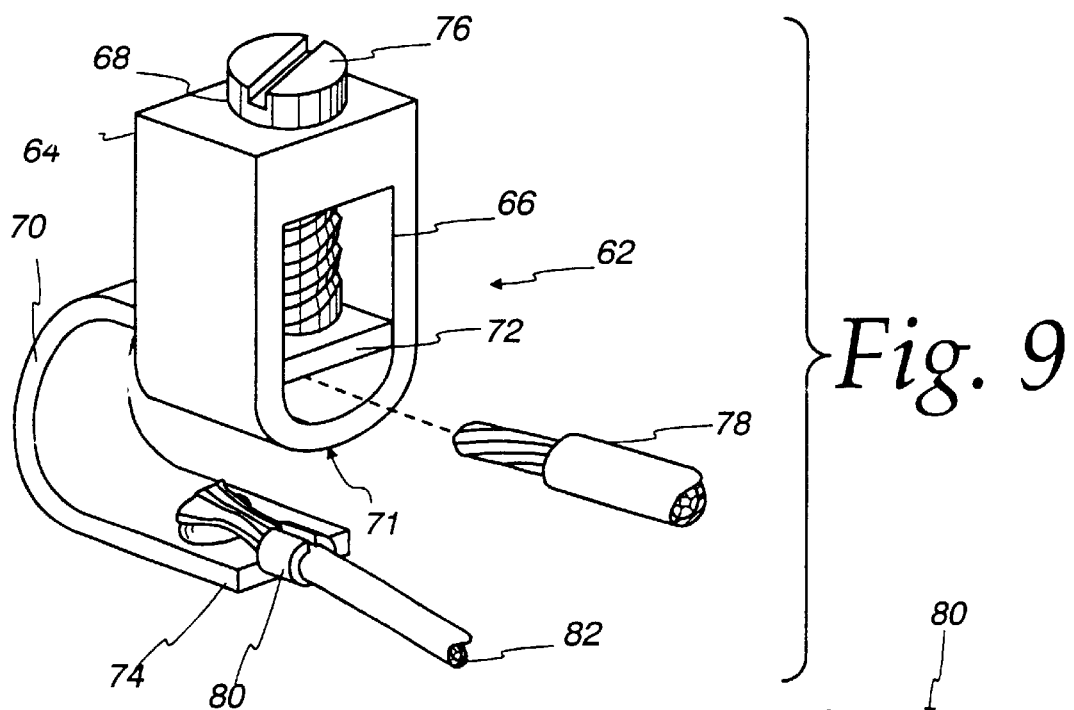
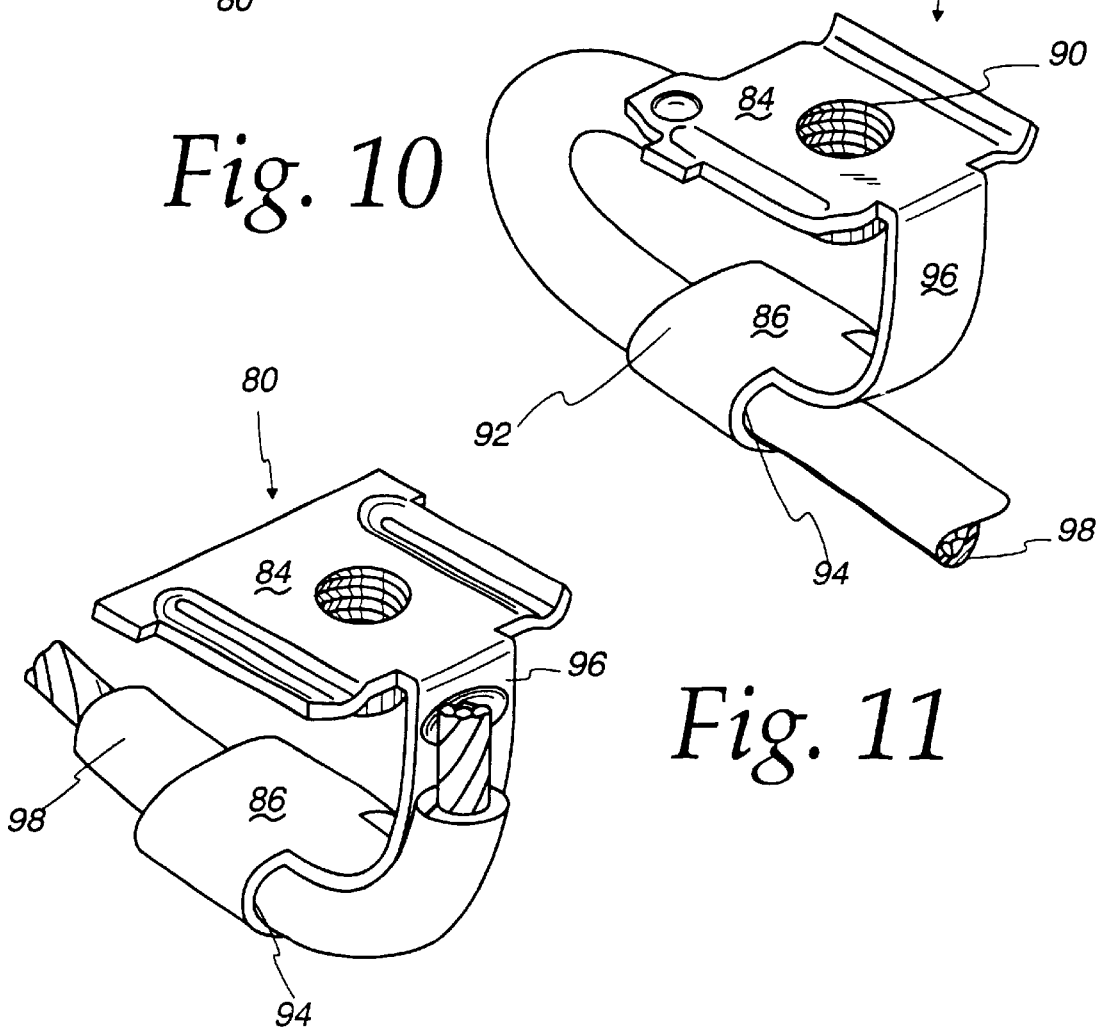
Fig. 9
Fig. 10
Fig. 11

ASSEMBLY METHODS FOR MINIATURE CIRCUIT BREAKERS WITH ELECTRONICS

CROSS-REFERENCE TO RELATED APPLICATIONS

This application is a divisional of U.S. patent application Ser. No. 08/796,745, filed Feb. 6, 1997, now U.S. Pat. No. 6,242,993, issued Jun. 5, 2001 and entitled "Automated Assembly Methods for Miniature Circuit Breakers With Electronics" which is a continuation in part of U.S. patent aplication Ser. No. 08/600,512 filed Feb. 13, 1996, now U.S. Pat. No. 5,682,101 for "Arcing Fault Detection System". U.S. patent application Ser. No. 08/600,512 is a continuation in part of U.S. patent applications Ser. No. 08/402,678, filed Mar. 13, 1995 now abandoned and entitled "Device and Method for Blocking Selected Arcing Fault Signals"; Ser. No. 08/402,600, filed Mar. 13, 1995 now abandoned and entitled "Voltage Sensing Arcing Fault Detector and Method"; Ser. No. 08/402,575, filed Mar. 13, 1995 now abandoned and entitled "Arcing Fault Detection System and Method"; Ser. No. 08/403,084, filed Mar. 13, 1995 now abandoned and entitled "Device and Method for Testing Arcing Fault Detectors"; and Ser. No. 08/403,033, filed Mar. 13, 1995 now abandoned and entitled "Current Sensing Arcing Fault Detector and Method".

Each of the above applications has the same assignee as the present invention, and each is incorporated herein by reference in its entirety.

FIELD OF THE INVENTION

The present invention relates to electrical circuit breakers and, more particularly, to apparatus and methods for assembling by automated production miniature circuit breakers which contain arcing fault detection systems.

BACKGROUND OF THE INVENTION

Electrical systems in residential, commercial and industrial applications usually include a panelboard for receiving electrical power from a utility source. The electrical power is then delivered from the panelboard to designated branch circuits supplying one or more loads. Typically, various types of protective devices are connected to the branch circuits to reduce the risk of injury, damage or fires. The protective devices may be mounted within the panelboard or external to the panelboard.

Circuit breakers are a well known type of protective device which are designed to trip open and interrupt an electric circuit in response to detecting overloads and short circuits. Overload protection is provided by a thermal element which, when heated by the increased current, will cause the circuit breaker to trip and interrupt the power. This can occur when too many loads draw power from the same branch circuit at the same time, or when a single load draws more power than the branch circuit is designed to carry. Short circuit protection is provided by an electromagnetic element that trips when sensing high current flow. Additionally, many circuit breakers include ground fault interruption (GFI) circuitry to protect against ground faults which occur when current flows from a hot conductor to ground through a person or object.

Arcing fault detectors are another type of protective device which may be employed in an electrical distribution system. Arcing fault detectors are designed to trip open and interrupt an electric circuit in response to arcing faults, which occur when electric current "arcs" or flows through ionized gas between two ends of a broken conductor, between two conductors supplying a load, or between a conductor and ground. Arcing faults typically result from corroded, worn or aged wiring or insulation, loose connections, wiring damaged by nails or staples through the insulation, and electrical stress caused by repeated overloading, lightning strikes, etc. The presence of an arcing fault creates a significant fire hazard because it generates heat which may ignite the conductor insulation and adjacent combustible materials. Standard circuit breakers typically can not detect arcing faults because branch or load impedance may cause the level of load current to be reduced below the trip curve setting of a standard circuit breaker.

Each branch circuit of the electrical distribution system may include a selected combination of standard circuit breaker components, arcing fault detection circuitry or GFI circuitry to protect the branch circuit from associated hazardous conditions including overcurrents, arcing faults and ground faults. Whatever combination is selected, it is preferred that the protective devices are packaged together within a miniature circuit breaker housing adapted to be positioned within an electrical distribution panelboard or load center.

The present invention relates to the production of circuit breakers including arcing fault detection components in conjunction with standard circuit breaker components and/or GFI. Production of such circuit breakers by automated equipment is desirable.

Consequently, the present inventors have sought improved arcing fault detectors which facilitate automated production, or, if desired, manual assembly, through "top-down" methods, which require access from only one side of the circuit breaker.

SUMMARY OF THE INVENTION

The present invention facilitates automated production (or hand assembly) of circuit breakers which include arcing fault detectors. Such detectors comprise a toroidal sensor having an annular core encompassing a current-carrying load line in which the sensing coil is wound helically on the core such as has been described in the patent applications referenced above.

In one embodiment, the assembly includes a circuit board and a two-piece sensor core in a two piece housing. The lower sections of the core and housing are connected to the circuit board and the upper sections of the core and housing are detachably mountable to their respective lower sections. A helical winding is placed on the lower core and is attached to conductive pins which make electrical contact with the circuit board. When the upper core is locked to the lower core, they form a hollow center oriented horizontally. Electrical power is supplied to an electrical load via attachment to a load line terminal located on one side of the sensing coil. The load line terminal extends through the hollow center of the sensing coil. An insulator is disposed around the portion of the load line terminal within the center of the sensing coil. A connection to the electrical supply is provided via a load terminal which is connected to the load line terminal after it has emerged on the opposite side of the sensing coil. In an alternative embodiment, the upper section of the housing is omitted.

In another embodiment, the sensing coil is positioned on the circuit board so that the hollow center of the coil is oriented vertically and the load line terminal is connected to the load terminal above the sensing coil. Alternatively, the sensing coil may be one-piece and positioned with the hollow center mounted horizontally. In such an embodiment, the terminal would be inserted within the sensing coil and weld connections made to the load terminal and the circuit board after the sensing coil has been positioned.

In other embodiments the neutral terminal connection to the circuit breaker is made through a strain relief member to facilitate automated assembly.

The invention also includes a power connector to a circuit board comprising a clip for frictional engagement with the load line terminal.

BRIEF DESCRIPTION OF THE DRAWINGS

In the drawings, which comprise a portion of this disclosure:

FIG. 1b is a plan view of a circuit breaker incorporating an arcing fault sensor packaged within the miniature circuit breaker housing of FIG. 1a;

FIG. 9 is a perspective view of a lug connection;

FIG. 10 is a perspective view of a strain relief member;

FIG. 11 is a perspective view of an alternative strain relief member;

DETAILED DESCRIPTION

This invention provides an improved apparatus and method for assembling miniature circuit breakers incorporating arcing fault detection. This invention is particularly useful for the automated assembly of miniature circuit breakers. The invention described herein, and all the preferred and alternative embodiments, allow for the efficient assembly of a miniature circuit breaker by manual or automated assembly to allow for increased productivity, product quality and profitability. One method of assembly that increases efficiency is "top down" assembly. This invention facilitates top down assembly by its use of components such as the two piece core and housing, the power connector clip, the slotted connectors, and the slotted circuit board configured to receive the clamp terminal with flanges. This invention also eliminates the need for flexible discrete wiring. Moreover, by employing pinch weld technology and top down assembly, this invention makes the efficient and economical mass production of miniature circuit breakers a reality. Of course, hand assembly is facilitated also, if it is used rather than automated production.

The invention relates to miniature circuit breakers which include arcing fault and/or ground fault detection systems operating in conjunction with standard circuit breaker components. Generally, the miniature circuit breaker will be enclosed in an insulating case and adapted to clip into an electrical panelboard, through which electrical power is distributed from a utility source to a plurality of branch circuits each defined by line and neutral conductors supplying electrical power to a load. The circuit breaker is electrically connected to both the line and neutral conductors and is designed to interrupt current in an associated branch circuit upon the occurrence of an arcing fault and/or ground fault, overcurrent or short circuit condition.

Figure 1A:
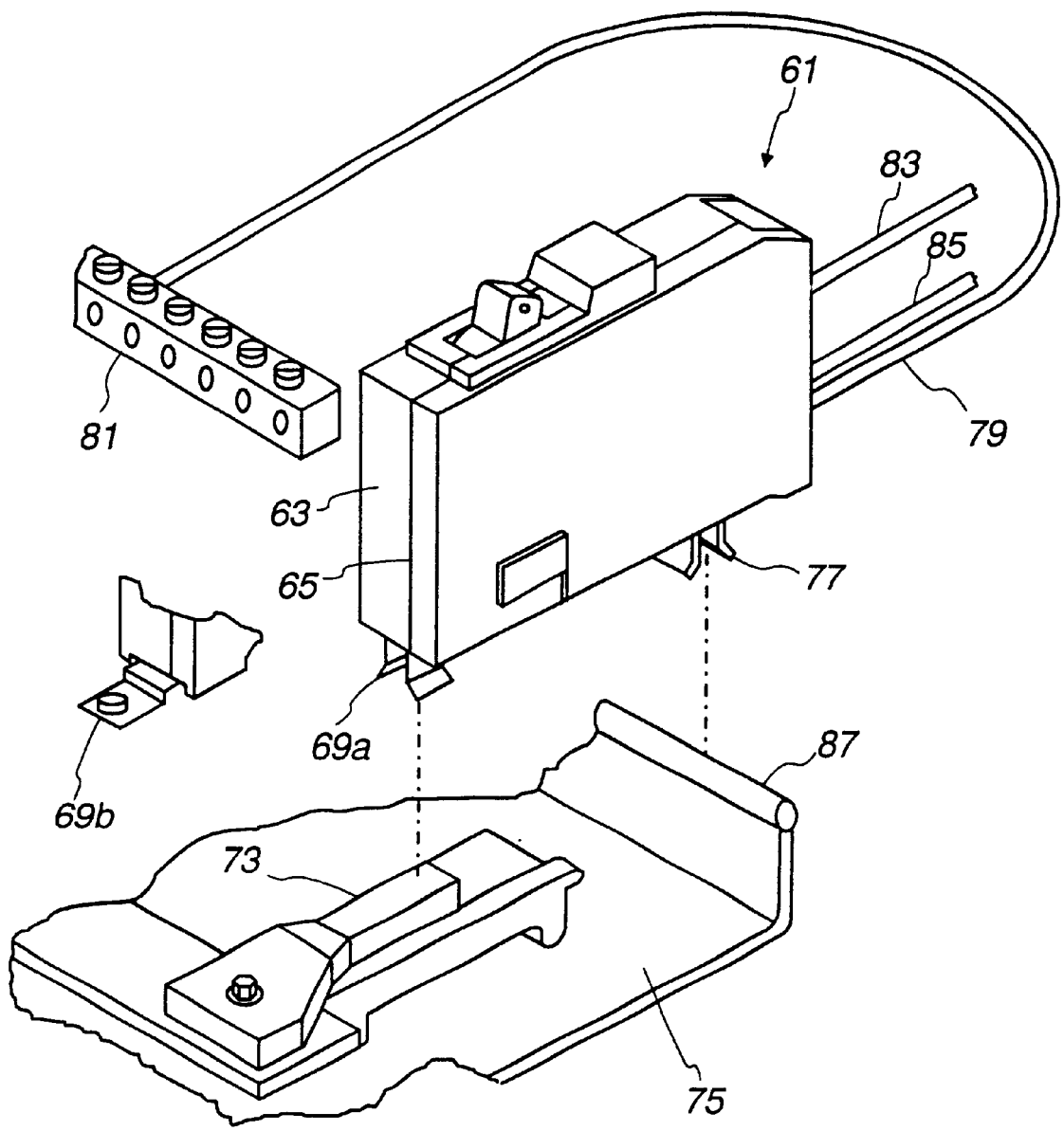
FIG. 1a is a perspective view of a miniature circuit breaker housing adapted to be mounted to a panelboard and which may include components according to the present invention.

FIG. 1a provides a perspective view of a miniature circuit breaker housing generally designated by reference numeral 61. The miniature circuit breaker housing 61 is comprised of an electrically-insulating base 63 closed at one face by a detachable cover 65 which together enclose the components of a miniature circuit breaker, which may comprise a standard circuit breaker, a ground fault interrupter module, an arcing fault detection system or any combination thereof. The Quik-Gard® circuit breaker, sold commercially by Square D Company, Cedar Rapids, Iowa represents an example of a product including standard circuit breaker components and a ground fault interrupter within a miniature circuit breaker housing. A clip 77 is provided for mounting the housing 61 to a mounting bracket 87 of a panelboard 75 of an electrical distribution system. A electrically-conductive jaw-like terminal 69a or bolt terminal 69b extends through the base 63 to be externally connected to a line bus bar 73 within the panelboard 75. Similarly, a panel neutral conductor 79 extends through the housing 61 for connection to a neutral bar 81 in the panelboard 75. External connections to the line and neutral conductors leading to the load of a branch circuit of the electrical distribution system are provided through a load line conductor 83 and load neutral conductor 85, respectively.

FIG. 1b illustrates a plan view of a circuit breaker 1 including standard circuit breaker components and arcing fault detection components disposed within the miniature circuit breaker housing 61 shown in FIG. 1a. As depicted in FIG. 1b, the miniature circuit breaker 1 is in a closed position, enabling line current to flow completely through the circuit breaker and toward the load of a designated branch circuit. Line current enters the circuit breaker 1 through the jaw-like terminal 69a and flows through a stationary contact carrier 89 integral with the jaw like terminal 69a. The stationary contact carrier 89 has a stationary contact 2 mounted thereon. A movable contact 3 mounted to a movable contact carrier 91 abuts against the stationary contact 2 when the circuit breaker 1 is in the closed position. Line current thereby flows from the stationary contact carrier 89 to the movable contact carrier 91 through the stationary and movable contacts 2 and 3, respectively.

A pigtail conductor 93 is electrically connected at one end to the movable contact carrier 91 and at another end to a yoke 95, enabling line current to flow from the movable contact carrier 91 to the yoke 95 when contacts 2 and 3 are in a closed position. A bimetal conductor 97 composed of two dissimilar thermostat materials is electrically connected to the yoke 95. The bimetal conductor 97 is electrically connected to an internal line conductor 101 which is connected to a load terminal 105. When contacts 2 and 3 are in the closed position, line current flows from the yoke 95 through the bimetal conductor 97 and through the internal line conductor 101. Thereafter, current flowing through the internal line conductor 101 passes through a sensing coil 103 which monitors the rate of change of line current flowing through the circuit breaker 1. The present invention in one aspect is related to methods for assembling certain components associated with sensing coil 103.

After exiting the sensing coil 103, the line current flows to a load terminal 105 to which the load line conductor 83 (FIG. 1a) may be attached to provide the line current to a load. The line current is electrically connected to circuit board 123 at connection 105a. The present invention in one aspect is related to methods and apparatus for connecting the load line conductor 83 to the load line terminal 105. The miniature circuit breaker 1 also includes a load neutral terminal 107 to which the load neutral conductor 85 (FIG. 1a) may be attached. The miniature circuit breaker further includes an internal neutral conductor is electrically connected to the neutral terminal 107 and the panel neutral conductor 79 described in relation to FIG. 1a. The internal neutral conductor is electrically connected to the circuit board 123 at connection 79a. The present invention in one aspect is related to methods and apparatus for connecting the internal neutral conductor, panel neutral conductor and load neutral conductor to the load neutral terminal 107. In embodiments with ground fault interruption (GFI) circuitry (not shown), the load neutral conductor would be routed through the sensor 103 along with the internal line conductor 101 to permit sensing of an imbalance of current flow between the internal line and neutral conductors 101 and 79 as is known in the art. A more complete description of GFI circuitry is disclosed in U.S. Pat. No. 5,446,431, assigned to the instant assignee and incorporated herein by reference.

The circuit breaker 1 may be tripped open in any of several ways, including manual control and in response to thermally and electromagnetically-sensed overload conditions and ground fault conditions. The mechanism for tripping open the circuit breaker 1 is described in detail in U.S. Pat. No. 5,446,431, assigned to the assignee of the present invention and incorporated herein by reference. Accordingly, it will be described only briefly herein.

The miniature circuit breaker 1 may be moved between the open and closed positions by a user manually moving the operating handle 111 to the right or left, respectively, causing corresponding movement of the top of the movable contact carrier 91 to the left or right of a pivot point. A toggle spring 113 is connected at one end to the operating handle 111 and at another end to the movable contact carrier 91. When the top of the movable contact carrier 91 is left of the handle pivot point, the toggle spring 113 serves to bias the bottom of the movable contact carrier 91 to the open position. Conversely, when the top of the movable contact carrier 91 is right of the pivot point, the toggle spring 113 biases the bottom of the movable contact carrier 91 to the closed position.

The miniature circuit breaker 1 is also designed to be tripped open in response to sensing various types of fault conditions. Upon the occurrence of a moderately sustained overload condition when the contacts 2 and 3 are in a closed position, the bimetal conductor 97 becomes heated and the lower end bends to the right. The bimetal conductor 97 may be adjusted by calibration screw 133. Bending of the bimetal conductor 97 by differential expansion causes an armature 115 and yoke 95 to swing counterclockwise and release a trip lever 117. The trip lever 117 rotates clockwise about pin 119, causing the toggle spring 113 to pull the bottom of the movable contact carrier 91 away from the stationary contact 2 and interrupt the current path.

Similarly, upon the occurrence of an extensive current overload condition, a high magnetic flux field is created around the yoke 95. The armature 115 is drawn toward the yoke 95 by the magnetic field, causing the trip lever 117 to become released from the armature 115. As described in relation to thermal trips, release of the trip lever 117 from the armature 115 causes the toggle spring 113 to pull the bottom of the movable contact carrier 91 away from the stationary contact 2 and interrupt the current path.

Finally, electronic components 121 mounted on a circuit board 123 are provided for processing the signal output of the sensor 103 and determining whether an arcing fault condition or ground fault condition are present. The electronic components 121 are preferably the same as those described in pending U.S. patent application Ser. No. 08/600,512, but it will be appreciated that any configuration of electronic components 92 known in the art for detecting arcing faults may be provided. Similarly, the electronic components 121 may reflect any configuration known in the art for sensing ground faults. At any rate, the electronic components 121 are designed to produce an "AFD" and/or "GFI" trip signal corresponding to whether the circuit breaker 1 is designed to sense arcing faults and/or ground faults. In response to generation of either an AFD or a GFI trip signal, a magnetic field is created around a trip solenoid 125, causing a plunger 127 to be drawn to the right. The plunger 127 is connected to a trip link 129, which in turn is connected to the armature 115, such that movement of the plunger 127 causes the armature 115 to be drawn to the right. As previously described, movement of the armature 115 to the right causes the trip lever 117 to be released and the current path through the circuit breaker 1 to be interrupted.

In an alternative embodiment of the present invention, the electronic components 121 may also be designed to generate a thermal/magnetic trip signal in response to overloads or short circuits, thus obviating the need for the bimetal, yoke and armature associated with the prior art. This capability is described in detail in U.S. Pat. No. 5,136,457, assigned to the assignee of the present invention and incorporated herein by reference. In this embodiment, the thermal/magnetic trip signal will cause the contacts of the circuit breaker 1 to be opened in substantially the same manner as they would in response to an AFD or a GFI trip signal.

Figure 2:
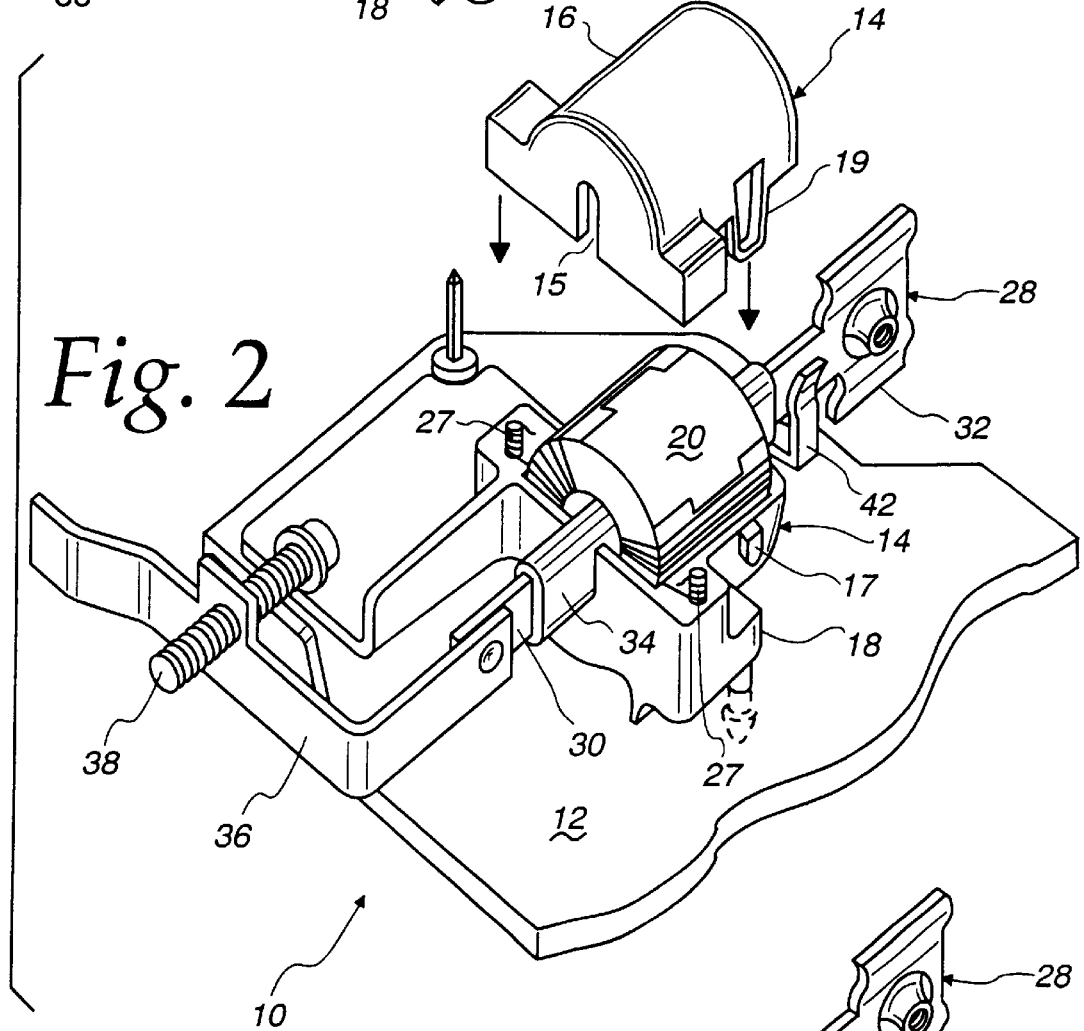
FIG. 2 is a perspective view of a sensing coil connected to an internal load connector and a load line terminal.
Figure 5:
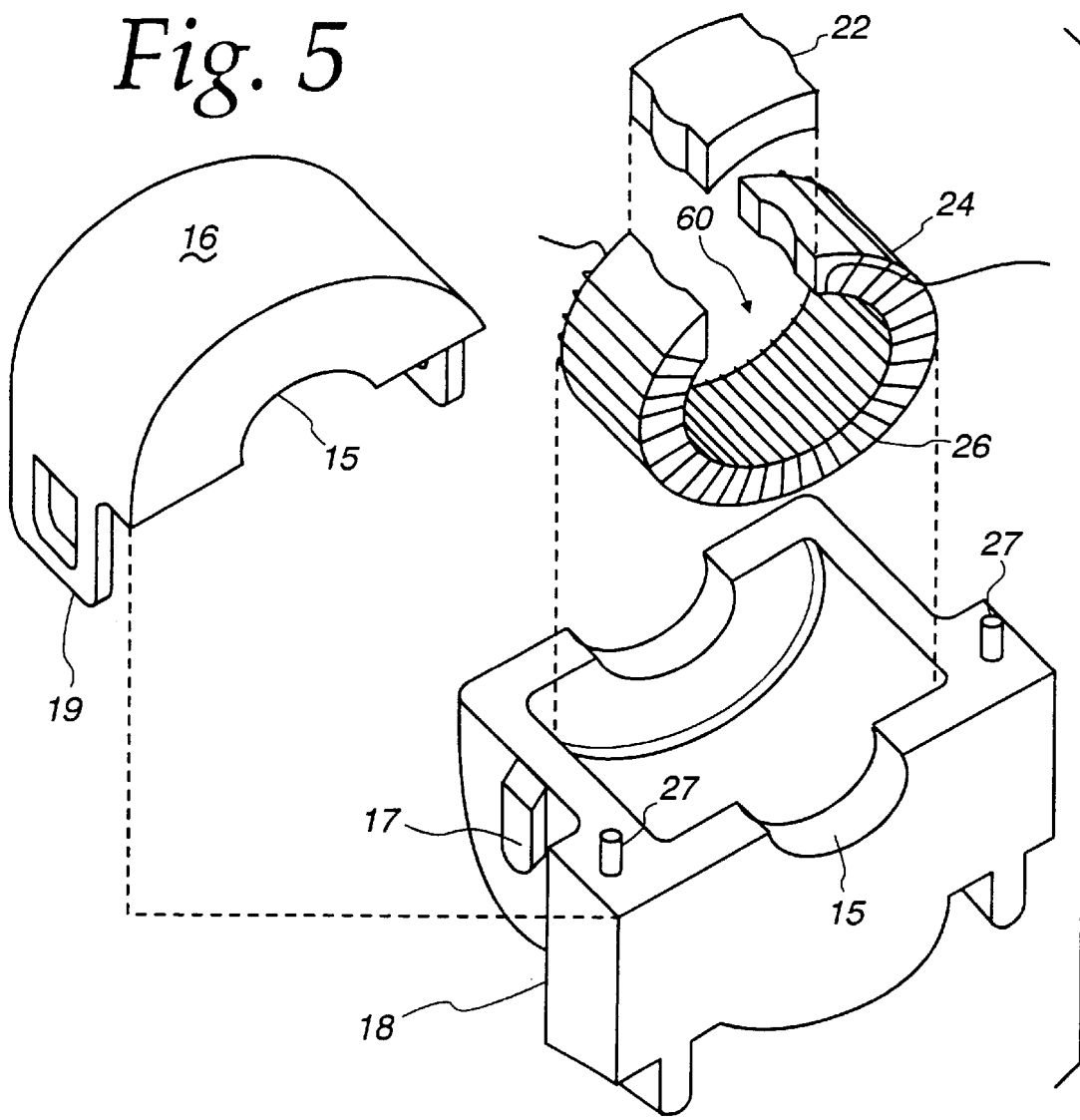
FIG. 5 is a perspective view of the housing and sensing coil.

FIGS. 2 and 5 show an assembly 10 which includes a printed circuit board 12 (FIG. 2 only) and a housing 14. The housing 14 has a removable upper section 16 and a lower section 18 which is connected to the circuit board 12. The sensing coil 20 comprises an upper core section 22 and a lower core section 24 (see FIG. 5). A winding 26 surrounds the lower core section 22, as best illustrated in FIG. 5. Each end of winding 26 is connected to a respective one of the electrically conductive pins 27 which continue through the housing 14 and thus are electrically attached to the circuit board 12. The upper core section 22 interlocks with the lower core section 24 to form a horizontally oriented hollow center 60 through which the line conductor (or both line and neutral conductors) of the circuit breaker are designed to pass. The upper section 16 of the housing 14 has a pair of catches 19 for snapping onto a respective pair of ramps 17 on the lower section 18. Thus, the upper and lower sections substantially enclose the sensing coil 20. It is feasible to omit upper section 16 if desired, in which case the outer cover (65 in FIG. 1*a*) serves as the upper housing. The housing 14 has a pair of openings 15 through which load line terminal 28 extends. These openings may have different configurations (e.g. compare FIGS. 2 and 5 depending on the shape of the load line terminal.

Returning to FIG. 2, load line terminal 28 has a long end 30 and a short end 32. The long end 30 is partially surrounded with insulator 34 where it passes through the hollow center of sensing coil 20. The long end 30 is disposed in sensing coil 20 so that the insulator 34 extends beyond the sensing coil 20 and through the opening 15. Line current passes through load terminal 36 which is connected to the long end 30 of load line terminal 28. Preferably, load terminal 36 is connected to long end 30 by a pinch weld as shown. Calibration screw 38 is disposed in load terminal 36 so that a portion of calibration screw 38 extends past load terminal 36.

Figure 3:
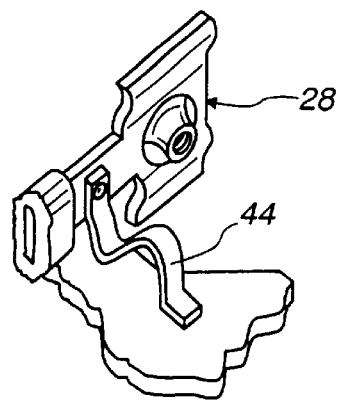
FIG. 3 is a partial perspective view of an alternate embodiment of the power connection to the circuit board.

Power is supplied to circuit board 12 via a connection to the load line terminal 28. In one embodiment, the connection is via clip 42 for frictionally and electrically engaging the short end 32 of load line terminal 28. Alternatively, the connection 42 can include a leaf spring 44 that is pinch welded to the short end 32 of load line terminal 28, as shown in FIG. 3.

Figure 4:
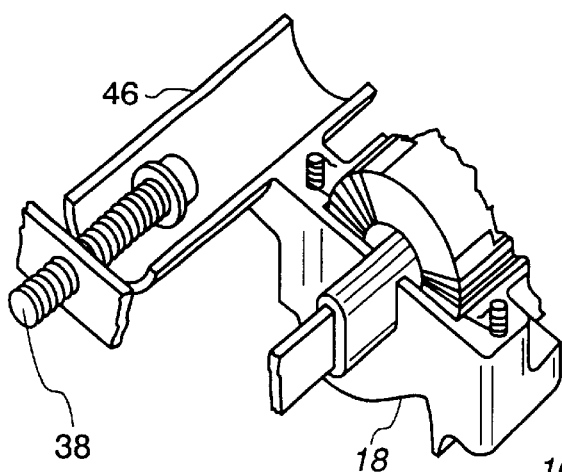
FIG. 4 is a partial perspective view of an alternative embodiment of the lower housing.

In a preferred embodiment illustrated in FIG. 4, lower section 18 of housing 14 can include an insulating channel 46 for insulating the calibration screw 38 and a screw driver inserted into the circuit breaker from the components on the circuit board 12. The insulating channel 46 is substantially U-shaped and configured to receive the calibration screw 38 and to assist in the alignment of a screw driver with the head of calibration screw 38. The insulating channel 46 is connected to or is integral with the lower section 18 of housing 14.

Figure 6:
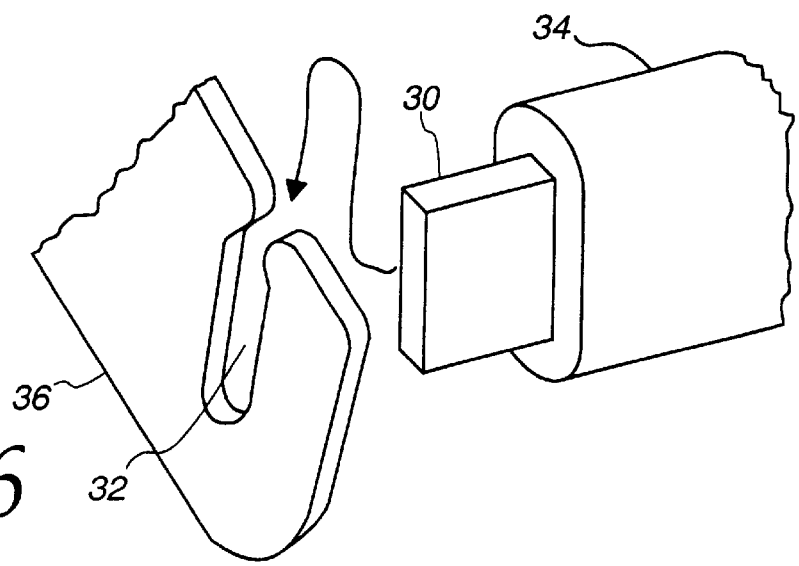
FIG. 6 is a partial perspective view of an alternative connection between the internal load connector and load line terminal.

FIG. 6 illustrates an alternative connection between the load terminal 36 and load line terminal 28. In one embodiment, load terminal 36 has a slot 32 that is configured to receive the long end 30 of the load line terminal 28. In an alternative embodiment (not shown), the load line terminal 28 has a similar slot that is configured to receive the end of load terminal 36.

Figure 7:
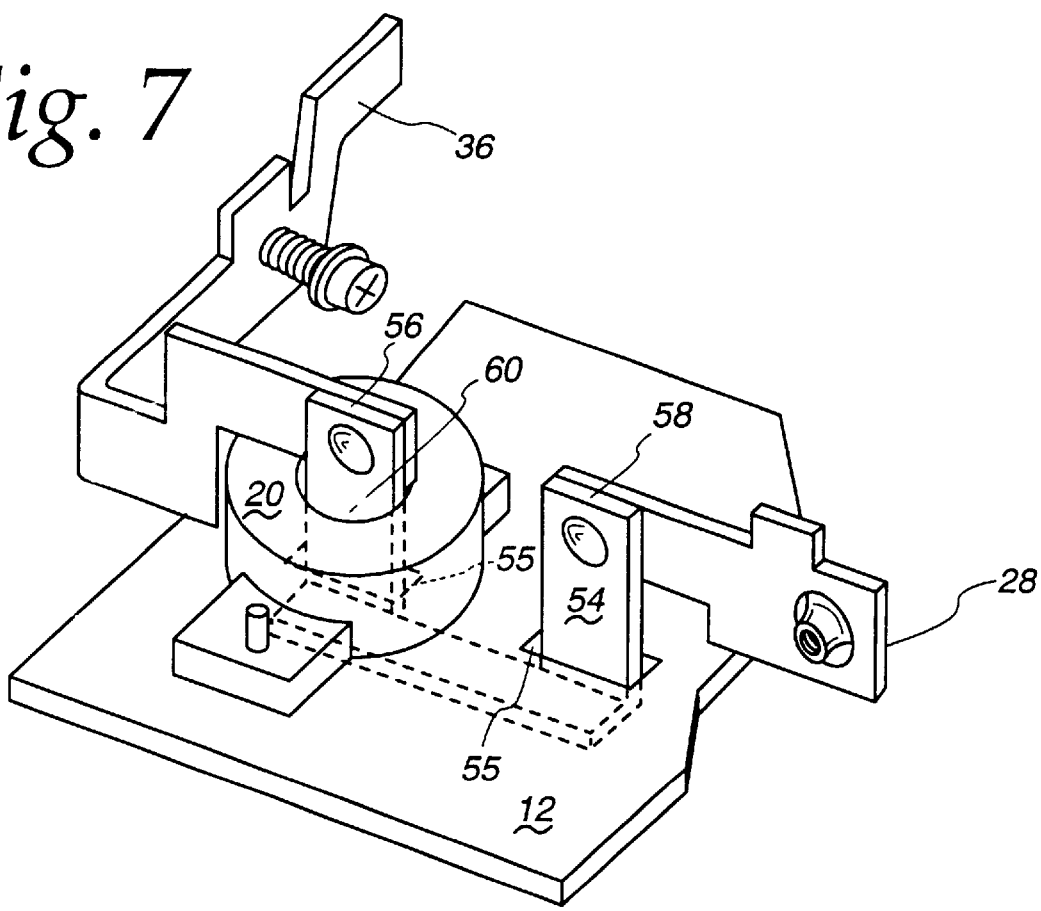
FIG. 7 is a perspective view of an alternative embodiment of the sensing coil and the connection of the internal load connector and the load line terminal.
Figure 8:
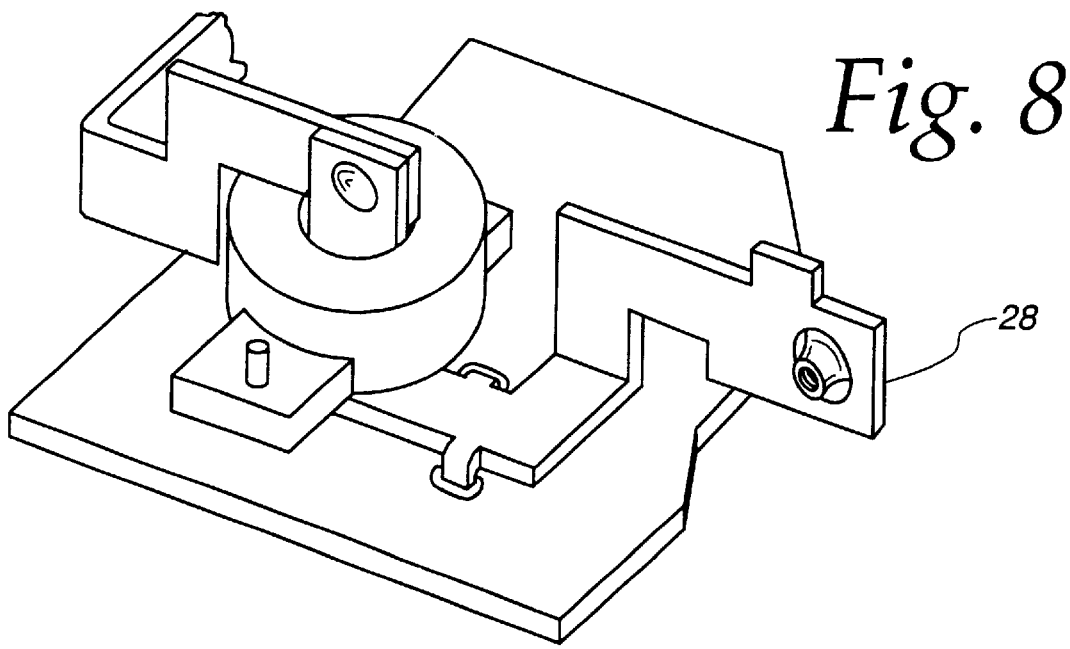
FIG. 8 is a partial perspective view of another alternative embodiment of the sensing coil of FIG. 7.

FIG. 7 illustrates an alternative embodiment in which the hollow center 60 of sensor 20 is oriented vertically rather than horizontally. Thus, the terminals pass vertically rather than horizontally through the coil as in the embodiment discussed above. Here, a sensor bus 54, which has a first end portion 56 and a second end portion 58, is connected to circuit board 12 through slots 55. The sensing coil 20 is disposed around the first end portion 56. Load terminal 36 is connected to the first end portion 56. Load line terminal 28 is connected to the second end portion 58. Preferably, both connections are made by pinch welding as shown. FIG. 8 illustrates an alternative embodiment wherein the load line terminal 28 and the sensor bus 54 are made from a single piece of metal.

Figure 14:
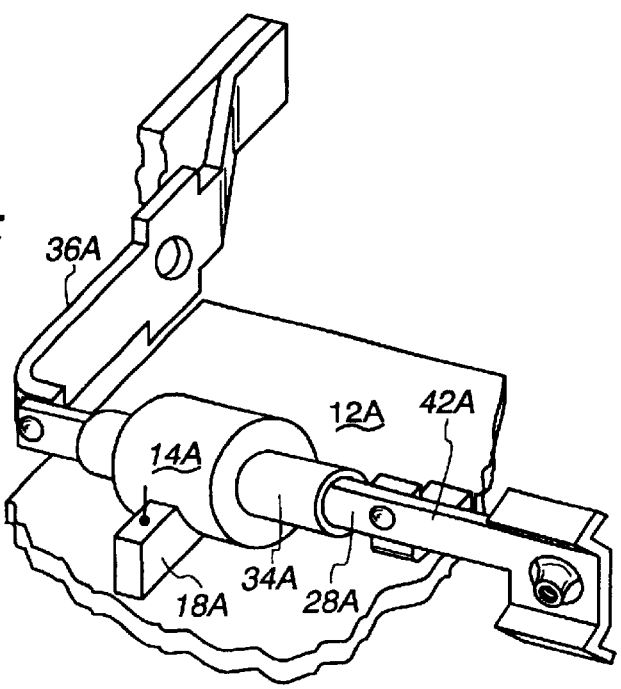
FIG. 14 is perspective view of another alternative embodiment employing a one-piece sensing coil horizontally mounted.
Figure 15:
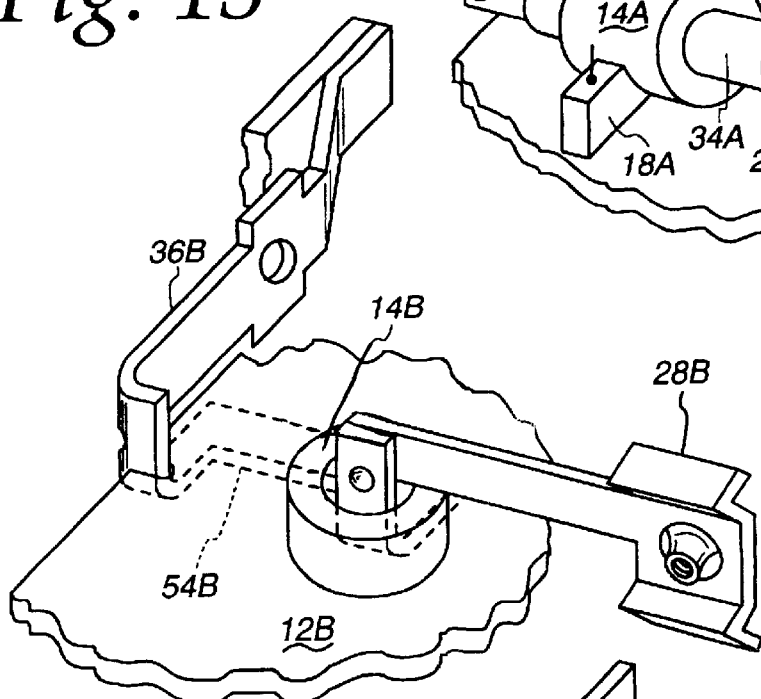
FIG. 15 is a perspective view of an alternative embodiment of the vertically positioned sensing coil of FIG. 7.
Figure 16:
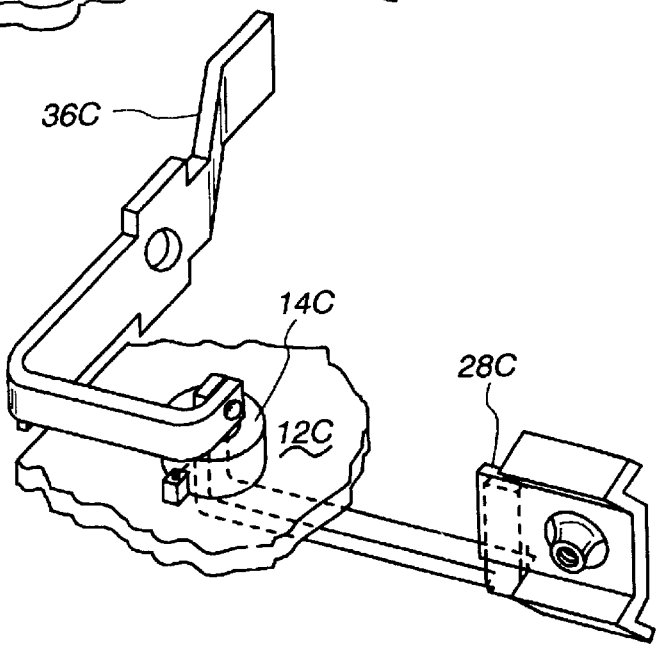
FIG. 16 is a perspective view of another alternative embodiment of the vertically positioned sensing coil of FIG. 7.

FIGS. 14–16 illustrate additional constructions to those shown in FIGS. 4 and 7–8 respectively. FIG. 14 shows a one-piece sensing coil 14A with the hollow center oriented horizontally. The load line terminal 28A is preassembled with the sensing coil 14A and placed on the circuit board, 12A and then pinch welded to the load terminal 36A and the circuit board connector 42A. A screw terminal may be used to connect the power supply as shown.

FIGS. 15 and 16 show a one-piece sensing coil (14B and 14C) with the hollow center oriented vertically. In those constructions, power is supplied through connections either under the circuit board (12B FIG. 16) or above the circuit board (12C FIG. 15). The connections to the load terminal (36B and 36C) are made by pinch welding above the sensing coil (14B and 14C), again facilitating top-down assembly.

Flexible, but restrained, wire terminations are important features of the circuit breakers of the invention to facilitate their automated assembly. Alternative methods of providing such wire terminations are shown in FIGS. 9–12.

A lug connection 62 is illustrated in FIG. 9. The lug 62 includes a top 64 and a hollow center 66. The top 64 includes a hole 68 connecting the top 64 to the hollow center 66. A neutral bus 70 which is connected via wire 82 to the panel neutral (not shown) is connected by lug 62 to the load neutral via wire 78. End 72 of bus 70 is positioned inside of the hollow center 66 of the lug 62 and extends underneath the hole 68. A wire binding screw 76 is disposed in the hole 68 and extends through the hollow center 66 in order to secure wire 78 between end 72 of the neutral bus 70 and bottom 71 of hollow center 66. A strain relief member 80 is provided at end 74 of the neutral bus 70.

Turning to FIG. 10, there is shown a strain relief member 80 which includes a top section 84 for connecting the load neutral wire (shown as 78 in FIG. 9) and a bottom section 86. The top section 84 is substantially flat and includes a hole 90 disposed therein. The load neutral wire is clamped between the flat section and a second mating plate (not shown) by means of a screw (not shown) threaded into hole 90. Strain relief region 92 defines a cavity 94 for receiving the panel neutral wire. The bottom section 86 forms a cylinder 92 which defines a cavity 94. The top section 84 and the bottom section 86 are connected together and separated by a solid member 96. Connected to the top section 84 of strain relief member 80 is a wire 98 (corresponding to wire 82 of FIG. 9). The wire 98 extends through the cavity 94 formed by the bottom section 86 and is secured therein in order to prevent strain on the connection of wire 98 to top section 84.

In a preferred embodiment, the wire 98 is pinch welded to top section 84 as shown.

In an alternative embodiment illustrated in FIG. 11, wire 98 is connected to the solid member 96 of the strain relief member 80. The wire 98 extends through cavity 94 in order to prevent strain on the connection of wire 98 to solid member 96. Preferably, the wire 98 is pinch welded to solid member 96. As described in FIG. 10 the load neutral wire 78 (of FIG. 9) would be clamped to the upper section 84.

Figure 12:
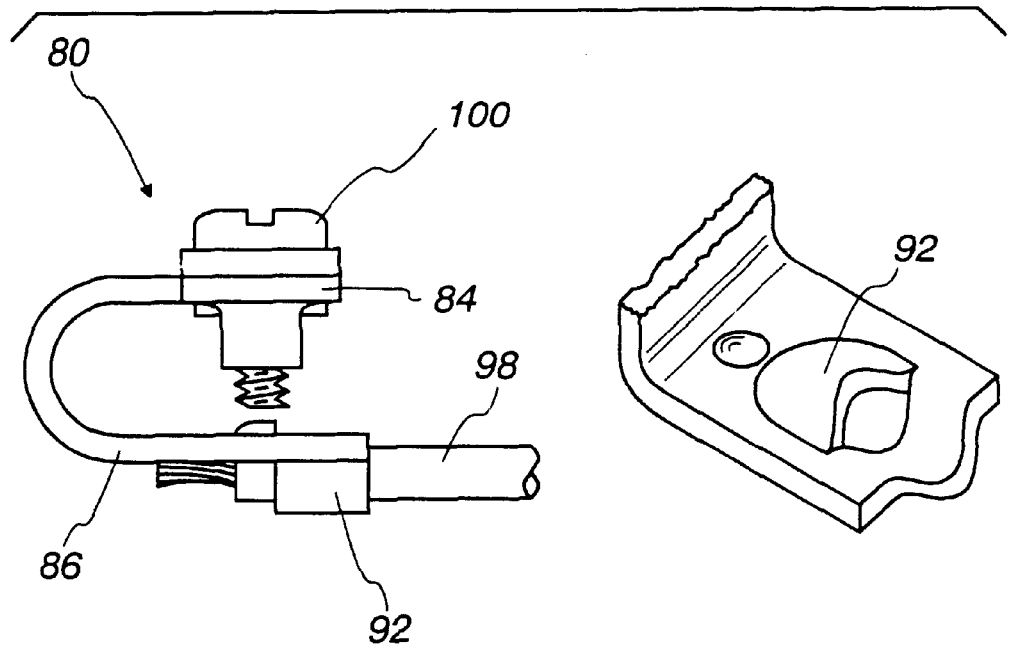
FIG. 12 is an elevation view and a perspective view of another alternative strain relief member.

In another alternative embodiment illustrated in FIG. 12, the load neutral wire is shown connected to the top section 84 by a screw 100 as previously described in connection with FIGS. 10–11. The panel neutral wire 98 is connected to the bottom section 86 of the strain relief member 80. Strain relief section 92 prevents strain on the connection of wire 98.

Figure 13:
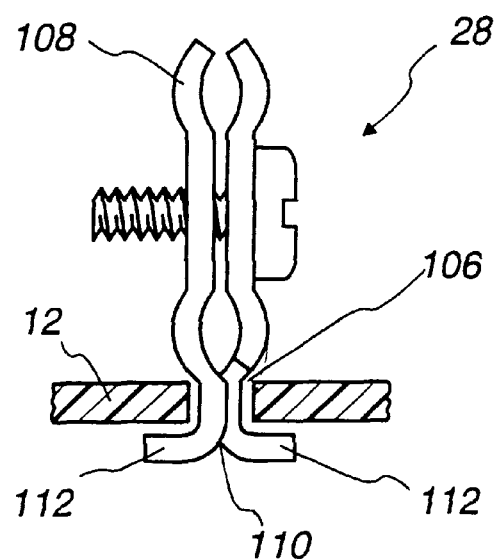
FIG. 13 is an elevation view of a load line terminal of the present invention.

FIG. 13 illustrates an embodiment in which a slot 106 is provided in the outer edge of the circuit board 12 to receive a clip which secures load line terminal 28 (see FIG. 3). The bottom sections of the clip 108 and the clamp terminal 28 are disposed in the slot 106 of the circuit board 12. Extending from the bottom of the clip and the clamp terminal are flanges 110 which are configured to limit the load line terminal 28 from moving in any direction except towards the center the circuit board 12.

While particular embodiments and applications of the present invention have been illustrated and described, it is to be understood that the invention is not limited to the precise construction and compositions disclosed herein and that various modifications, changes, and variations will be apparent from the foregoing descriptions without departing from the spirit and scope of the invention as defined in the appended claims.

What is claimed is:

1. A method of assembling an apparatus for use in arc fault detection systems comprising the steps of:

providing a sensing coil having a single core, the core including a lower core section, an upper core section, and a hollow center, the lower core section and the upper core section being separate parts;

winding a coil on the lower core section of said core;

placing the lower core section in a lower housing;

providing a load line terminal having a short end and a long end, the short end for connecting to a load, the long end for disposing in said sensing coil;

surrounding a section of the long end with an insulator;

placing the insulated long end of the load line terminal through the hollow center of the core so that part of the long end extends out of the sensing coil;

interlocking the upper core section to the lower core section to form said core having the hollow center, engaging an upper housing with the lower housing to enclose said sensing coil;

securing the lower housing to a circuit board;

connecting a load terminal to the long end of the load line terminal; and connecting a power connector to said circuit board.

2. A method of assembling an apparatus for use in arc fault detection systems comprising the steps of:

providing a sensing coil having a single core, the core including a lower core section, an upper core section, and a hollow center, the lower core section and the upper core section being separate parts;

winding a coil on the lower core section of said core;

placing the lower core section in a lower housing;

securing the lower housing to a circuit board;

providing a load line terminal having a short end and a long end, the short end for connecting to a load, the long end for disposing in said sensing coil;

surrounding a section of the long end with an insulator;

placing the insulated long end of the load line terminal through the hollow center of said core so that part of the long end extends out of the sensing coil;

interlocking the upper core section to the lower core section to form said core;

connecting a load terminal to the long end of the load line terminal; and connecting a power connector to said circuit board.

* * * * *